United States Patent
Jeong et al.

(10) Patent No.: US 9,048,210 B2
(45) Date of Patent: Jun. 2, 2015

(54) TRANSISTORS AND METHODS OF MANUFACTURING THE SAME

(75) Inventors: Hyung-su Jeong, Suwon-si (KR);
Jai-kwang Shin, Anyang-si (KR);
Nam-young Lee, Hwaseong-si (KR);
Ji-hoon Lee, Yeongcheon-si (KR);
Min-kwon Cho, Hwaseong-si (KR);
Yong-cheol Choi, Paju-si (KR);
Hyuk-soon Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 326 days.

(21) Appl. No.: 13/550,032

(22) Filed: Jul. 16, 2012

(65) Prior Publication Data

US 2013/0200427 A1    Aug. 8, 2013

(30) Foreign Application Priority Data

Feb. 7, 2012    (KR) .......................... 10-2012-0012534

(51) Int. Cl.
*H01L 29/36* (2006.01)
*H01L 29/66* (2006.01)
*H01L 29/739* (2006.01)

(52) U.S. Cl.
CPC ............ *H01L 29/36* (2013.01); *H01L 29/6634* (2013.01); *H01L 29/7397* (2013.01)

(58) Field of Classification Search
CPC ............ H01L 29/7397; H01L 29/7813; H01L 29/7395; H01L 29/4236
USPC ............................ 438/270; 257/330
See application file for complete search history.

(56) References Cited

U.S. PATENT DOCUMENTS 8,299,494 B2 * 10/2012 Yilmaz et al. ................. 257/139
2010/0264391 A1    10/2010 Jain et al.

FOREIGN PATENT DOCUMENTS

| JP | 2005-158804 A | 6/2005 |
| JP | 2008-004739 A | 1/2008 |
| JP | 2008-053611 A | 3/2008 |
| KR | 10-0902848 B1 | 6/2009 |
| KR | 2010-0075239 A | 7/2010 |
| KR | 10-0977413 B1 | 8/2010 |

* cited by examiner

*Primary Examiner* — David Vu
(74) *Attorney, Agent, or Firm* — Harness, Dickey & Pierce, P.L.C.

(57) ABSTRACT

A transistor includes a device portion and a collector layer. The device portion is in a first side of a semiconductor substrate, and includes a gate and an emitter. The collector layer is on a second side of the semiconductor substrate, which is opposite to the first side. The collector layer is an impurity-doped epitaxial layer and has a doping profile with a non-normal distribution.

11 Claims, 11 Drawing Sheets

TRANSISTORS AND METHODS OF MANUFACTURING THE SAME

CROSS-REFERENCE TO RELATED APPLICATION

This application claims priority under 35 U.S.C. §119 to Korean Patent Application No. 10-2012-0012534, filed on Feb. 7, 2012, in the Korean Intellectual Property Office, the entire disclosure of which is incorporated herein by reference.

BACKGROUND

1. Field

Example embodiments relate to transistors and methods of manufacturing the same, for example, insulated gate bipolar transistors (IGBTs) and methods of manufacturing the same.

2. Description of the Related Art

Insulated gate bipolar transistors (IGBTs) have a structure combining a bipolar junction transistor (BJT) and a metal-oxide-semiconductor field effect transistor (MOSFET). Thus, IGBTs have relatively good current driving characteristics from the BJT and relatively good switching characteristics from the MOSFET with an insulated gate. IGBTs may be used as devices for controlling relatively high voltage and/or relatively high current. In one example, IGBTs may be used in power devices.

A conventional IGBT includes a gate and an emitter on a front side, and a collector on a back side. In one example, the collector is a region heavily doped with impurity ions of a given, desired or predetermined conductivity-type. Another doped region is disposed adjacent to the collector. A doping profile of the back side portion of the IGBT may significantly affect operating characteristics of the IGBT, for example, hole-injection and tail current characteristics. For this reason, in order to improve operation characteristics of an IGBT, there is as demand to improve doping profiles of elements disposed on the back side portion of the IGBT.

SUMMARY

At least some example embodiments provide transistors having improved operating characteristics, and methods of manufacturing the same.

At least some example embodiments provide transistors having a back side portion with a controlled doping profile, and methods of manufacturing the same.

At least some example embodiments provide transistors to which an epitaxial process is applied, and methods of manufacturing the same.

Additional aspects will be set forth in part in the description which follows and, in part, will be apparent from the description, or may be learned by practice of example embodiments.

At least one example embodiment provides a transistor including: a device portion in a first side of a semiconductor substrate, the device portion including a gate and an emitter; and a collector layer on a second side of the semiconductor substrate, the second side being opposite the first side. The collector layer is an impurity-doped epitaxial layer, and has a doping profile with a non-normal distribution.

According to at least some example embodiments, the collector layer may have a constant or substantially constant doping concentration in a depth direction.

Alternatively, the collector layer may have a doping concentration that increases or decreases in the depth direction.

The transistor may further include a buffer layer between the semiconductor substrate and the collector layer. The buffer layer may be an impurity-doped epitaxial layer and have a doping profile with a non-normal distribution.

The buffer layer may have a constant or substantially constant doping concentration in the depth direction.

Alternatively, the buffer layer may have a doping concentration that increases or decreases in a depth direction.

The buffer layer may be a field stop layer.

According to at least some example embodiments, the device portion may include: a first-conductivity type well region in a first or front side portion of the semiconductor substrate; a second-conductivity type impurity region defined in the first-conductivity type well region; a gate for electrically controlling a portion of the first-conductivity type well region adjacent to the second-conductivity type impurity region; and an emitter electrode that electrically contacts the first-conductivity type well region and the second-conductivity type impurity region.

The transistor may be an insulated gate bipolar transistor (IGBT).

The transistor may be used as, for example, a power device.

At least one other example embodiment provides a method of manufacturing a transistor. According to at least this example embodiment, the method includes: epitaxially growing a collector layer on a first side of a semiconductor substrate; removing a portion of the semiconductor substrate from second side of the semiconductor substrate; and forming a device portion including a gate and an emitter in a surface region of the semiconductor substrate that is exposed by removing the portion of the second side of the semiconductor substrate.

According to at least some example embodiments, an impurity may be doped into the collector layer during the forming of the collector layer. The collector layer may have a doping profile with a non-normal distribution.

The method may further include: epitaxially growing a buffer layer on the first side of the semiconductor substrate before the epitaxially growing of the collector layer. The collector layer may be epitaxially grown on the buffer layer.

When epitaxially growing the buffer layer, an impurity may be doped into the buffer layer. The buffer layer may have a doping profile with a non-normal distribution. The buffer layer may be a field stop layer.

The method may further include: attaching a support substrate to the collector layer before removing the portion of the semiconductor substrate. The support substrate may be removed after forming the device portion. A collector electrode contacting the collector layer may be formed after removing the support substrate.

According to at least some example embodiments, the forming of the device portion may include: forming a first-conductivity type well region in a surface portion of the semiconductor substrate; forming a second-conductivity type impurity region in the well region; forming a gate to electrically control a portion of the first-conductivity type well region adjacent to the second-conductivity type impurity region; and forming an emitter electrode that electrically contacts the first-conductivity type well region and the second-conductivity type impurity region.

At least one other example embodiment provides a method of manufacturing a transistor. According to at least this example embodiment, the method includes: forming at least a part of a device portion on a first side portion of a semiconductor substrate, the device portion including a gate and an emitter; removing a portion of the semiconductor substrate from a second side thereof; and forming a collector layer on a surface of the semiconductor substrate that is exposed by the removing of the portion of the semiconductor substrate, the collector layer being formed to have a doping profile with a non-normal distribution.

According to at least some example embodiments, the collector layer may have a constant or substantially constant doping concentration in a thickness or depth direction. Alternatively, the collector layer may have a doping concentration that increases or decreases in a thickness or depth direction.

The method may further include: forming a buffer layer on the surface of the semiconductor substrate before forming the collector layer, wherein the collector layer may be epitaxially grown on the buffer layer.

The buffer layer may have a doping profile with a non-normal distribution.

The buffer layer may have a constant or substantially constant doping concentration in a thickness or depth direction.

Alternatively, the buffer layer may have a doping concentration that increases or decreases in a thickness or depth direction.

The buffer layer may be a field stop layer.

The forming of the device portion may include: forming a first ion implanted region by implanting first-conductivity type impurity ions into the front side portion of the semiconductor substrate; and forming a second ion implanted region by implanting second-conductivity type impurity ions into a surface portion of the first ion implanted region.

In the forming of the collector layer, the impurity ions in the first and second ion implanted regions may be thermally diffused to form a well region from the first ion implanted region and an impurity region from the second ion implanted region.

The method may further include: forming a buffer layer on the surface of the semiconductor substrate before forming the collector layer. When at least one of the buffer layer and collector layer, the impurity ions in the first and second ion implanted regions may be thermally diffused to form a well region from the first ion implanted region and an impurity region from the second ion implanted region.

The forming of the device portion may include: forming a gate insulated from the first and second ion implanted regions; and forming an emitter electrode electrically connected with the first and second ion implanted regions.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
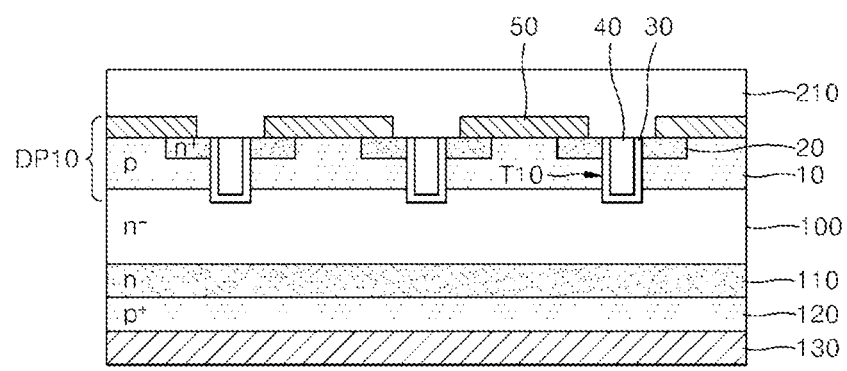
FIG. 1 is a cross-sectional view of a transistor according to an example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of a transistor and a method of manufacturing the same will now be described with reference to the accompanying drawings. In the drawings, the widths and thicknesses of layers and regions are exaggerated for clarity.

FIG. 1 is a cross-sectional view of a transistor according to an example embodiment.

Referring to FIG. 1, the transistor includes a device portion DP10 on a front side portion of a semiconductor substrate 100. The semiconductor substrate 100 may be, for example, a silicon substrate. The semiconductor substrate 100 may be lightly doped with n-type impurities. In the semiconductor substrate 100, a doping concentration of the n-type impurities may be about $10^{13} \sim 10^{16}/cm^3$, for example. In consideration of this concentration level of the n-type impurities, the semiconductor substrate 100 may be regarded as an n-type substrate. However, a material and doping concentration of the semiconductor substrate 100 are not limited to the above, and may be varied.

Still referring to FIG. 1, the device portion DP10 includes a first-conductivity type well region 10, a second-conductivity type impurity region 20, a gate 40, and an emitter electrode 50. The first-conductivity type well region 10 is formed in an upper surface portion (first or front side portion) of the semiconductor substrate 100. The first-conductivity type well region 10 may be a p-type impurity-doped region. In the first-conductivity type well region 10, a doping concentration of p-type impurities may be about $10^{15} \sim 10^{19}/cm^3$, for example. In consideration of this concentration level of the p-type impurities, the first-conductivity type well region 10 may be regarded as a p0 region or a p+ region.

The second-conductivity type impurity region 20 is formed in an upper surface portion of the first-conductivity type well region 10. The second-conductivity type impurity region 20 may be a region heavily doped with n-type impurities (e.g., an n+ region). The second-conductivity type impurity region 20 may have a doping concentration of n-type impurities of, for example, about $10^{18} \sim 10^{21}/cm^3$.

The gate 40 is electrically insulated from the first-conductivity type well region 10 and the second-conductivity type impurity region 20. The gate 40 is insulated from the first-conductivity type well region 10 and the second-conductivity type impurity region 20 by the gate insulation layer 30. A trench T10 is formed in the semiconductor substrate 100, and the gate insulation layer 30 and the gate 40 are disposed in the trench T10. The trench T10 is formed to be deeper than the first-conductivity type well region 10 so as to pass through the second-conductivity type impurity region 20 and the first-conductivity type well region 10. Thus, the second-conductivity type impurity region 20 is divided by the trench T10. The first-conductivity type well region 10 is also divided by the trench T10. The gate insulation layer 30 is disposed on a bottom and inner side of the trench. The gate 40 is disposed on the gate insulation layer 30 to fill the trench T10. The first-conductivity type well region 10 adjacent to the gate 40 functions as a channel region, and electrical characteristics of the channel region are controlled by the gate 40. The emitter electrode 50 is disposed to be electrically connected with the first-conductivity type well region 10 and the second-conductivity type impurity region 20. In this example, the emitter electrode 50 is disposed to contact both the first-conductivity type well region 10 and the second-conductivity type impurity region 20. A passivation layer 210 covering the device portion DP10 is further disposed on the front side portion of the semiconductor substrate 100.

A buffer layer 110 and a collector layer 120 are sequentially disposed on a back (e.g., second or under) side of the semiconductor substrate 100. A collector electrode 130 is further disposed on a lower surface of the collector layer 120. In this example, each of the buffer layer 110 and the collector layer 120 are an epitaxial layer including impurities. The buffer layer 110 may be an n-type impurity-doped layer. A material of the buffer layer 110 may be, for example, silicon or the like. The buffer layer 110 may have an n-type impurity concentration that is greater than the n-type impurity concentration of the semiconductor substrate 100. For example, the buffer layer 110 may have an n-type impurity concentration of about $10^{14} \sim 10^{18}/cm^3$. In consideration of this concentration level of the n-type impurities, the buffer layer 110 may be regarded as an nO layer. The buffer layer 110 may have a thickness of about 0~10 μm, for example. The buffer layer 110 may be a field stop layer. In this regard, the buffer layer 110 may function to stop an electric field applied between the emitter electrode 50 and the collector electrode 130. The collector layer 120 may be a p-type impurity-doped layer. A material of the collector layer 120 may be, for example, silicon or the like. The collector layer 120 may have a p-type impurity concentration of about $10^{17} \sim 10^{21}/cm^3$. In consideration of this concentration level of the p-type impurities, the collector layer 120 may be regarded as a p+ layer. The collector layer 120 may have a thickness of about 0~5 μm, for example. The collector electrode 130 may be formed of any of various conductive materials, such as a metal or a conductive oxide.

The buffer layer 110 and the collector layer 120 may have a doping profile with non-normal distribution (e.g., non-Gaussian distribution). The doping profiles of the buffer layer 110 and the collector layer 120 may be appropriately controlled according to the application or use of the transistor. For example, the buffer layer 110 may have a constant or substantially constant doping concentration in a depth direction. In this example, the buffer layer 110 may have a constant or substantially constant doping concentration throughout the depth of the layer. Alternatively, the buffer layer 110 may have a doping concentration that increases or decreases in the depth direction. In this example, the buffer layer 110 may have a doping concentration that varies within the layer. This is similar or substantially similar in the collector layer 120. In this example, the collector layer 120 may have a doping concentration that is constant, substantially constant, that increases or decreases in a depth direction.

While the buffer layer 110 is grown by an epitaxial process, a given, desired or predetermined type of impurities may be doped into the buffer layer 110. Likewise, while the collector layer 120 is grown by an epitaxial process, a given, desired or predetermined type of impurities may be doped into the collector layer 120. As described above, since impurities are doped into the buffer layer 110 and the collector layer 120 while growing of the buffer layer 110 and the collector layer 120 by the epitaxial process, the doping profiles thereof may be controlled more easily.

If a buffer region and a collector region are formed by injecting impurity ions into a back side of a substrate by ion implantation and then annealing the impurity ion-injected region, controlling the doping profile of the buffer region and collector region is relatively difficult. This is because the impurity ions diffuse and form a doping profile with Gaussian distribution (e.g., normal distribution) when annealing of the ion-injected region. Accordingly, it is relatively difficult to control the doping profile of the back side portion of the semiconductor substrate accurately. However, as in the above-described example embodiments, when the buffer layer 110 and the collector layer 120 are doped with impurities by supplying an impurity source gas while being grown by an epitaxial process, the doping profiles of the buffer layer 110 and the collector layer 120 may be controlled more accurately. The doping profiles of the buffer layer 110 and the collector layer 120 may be more easily controlled by adjusting a supplied amount and concentration of the impurity source gas. Therefore, according to at least some example embodiments, the doping profiles of the buffer layer 110 and the collector layer 120 are more accurately controllable according to purpose. Consequently, a transistor with improved performance due to the improved (e.g., optimized) doping profile may be implemented more easily. For example, a transistor with improved hole-injection and tail current characteristics may be implemented.

Figure 2:
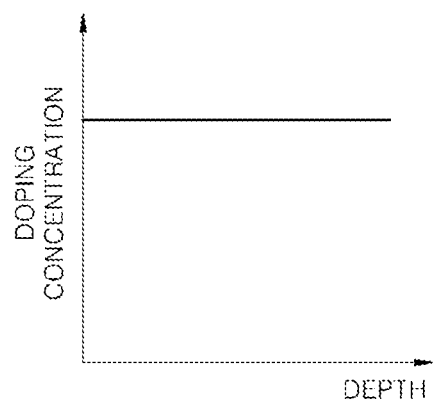
FIGS. 2 to 4 are example graphs of doping profiles of a buffer layer and/or a collector layer of FIG. 1 according to example embodiments.
Figure 3:
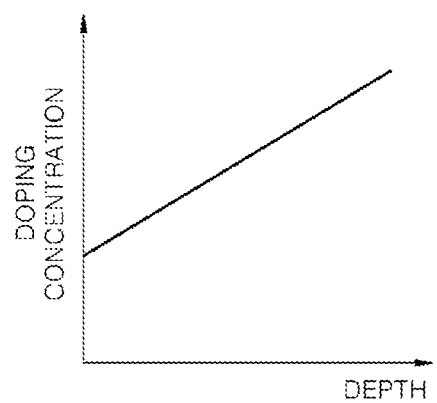
Figure 4:
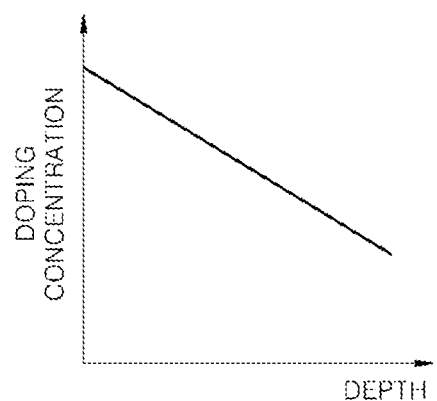

FIGS. 2 to 4 are graphs of doping profiles of the buffer layer 110 or the collector layer 120 of FIG. 1 according to example embodiments.

Referring to FIG. 2, the buffer layer 110 and/or the collector layer 120 has a more uniform doping concentration in a depth direction.

Referring to FIG. 3, the buffer layer 110 and/or the collector layer 120 has a doping concentration increasing in the depth direction.

Referring to FIG. 4, the buffer layer 110 and/or the collector layer 120 has a doping concentration decreasing in the depth direction.

As can be appreciated from FIGS. 3 and 4, the buffer layer 110 and/or the collector layer 120 may have a doping concentration that varies in the depth direction.

The buffer layer 110 and/or the collector layer 120 may have any one of the doping profiles of FIGS. 2 to 4, or a combination of two thereof. In one example, the buffer layer 110 may have the doping profile of FIG. 3 or 4, whereas the collector layer 120 may have the doping profile of FIG. 2. In another example, the collector layer 120 may have the doping profile of FIG. 3 or 4, whereas the buffer layer 110 may have the doping profile of FIG. 2.

The doping profiles of FIGS. 2 to 4 are examples only, and thus, may be varied in a variety of ways. In at least some example embodiments, the doping concentration may increase to a given, desired or predetermined depth within the layer or layers and decrease therefrom in the depth direction. In some other example embodiments, the doping concentration may decrease to a given, desired or predetermined depth and increase therefrom in the depth direction. The doping profiles of the buffer layer 110 and the collector layer 120 may be modified in other ways.

Referring back to FIG. 1, the transistor of FIG. 1 may be an insulated gate bipolar transistor (IGBT). In this example embodiment, the first-conductivity type well region 10, the collector layer 120, and a region of the semiconductor substrate 100 there between may form a bipolar junction transistor (BJT) with a PNP structure. In this case, the region of the semiconductor substrate 100 between the first-conductivity type well region 10 and the buffer layer 110 is a drift region or base region of the BJT. Meanwhile, the gate 40, the second-conductivity type impurity region 20, and a region of the semiconductor substrate 100 underlying the gate 40 form a field effect transistor (FET). In the FET, the second-conductivity type impurity region 20 is a source region, and the region of the semiconductor substrate 100 underlying the gate 40 is a drain region. The first-conductivity type well region 10 adjacent to the gate 40 is a channel region of the FET. If a channel is formed in the first-conductivity type well region 10 adjacent to the gate 40, an electric current may flow between the second-conductivity type impurity region 20 and the semiconductor substrate 100, Consequently, the BJT with the PNP structure may turn on, and an electric current may flow between the emitter electrode 50 and the collector electrode 130. In this regard, holes may flow from the collector electrode 130 toward the emitter electrode 50, while electrons (e−) may flow from the emitter electrode 50 toward the collector electrode 130. The insulated gate 40 of the FET may improve switching characteristics, and the BJT may improve current driving characteristics. The transistor described above may be used as a power device. However, the transistor may be used for a variety of purposes, not limited to the above.

In the transistor of FIG. 1, the structure of the device portion DP10 on the front side of the semiconductor substrate 100 may be varied in a variety of ways. For example, the gate 40 may have a different structure. Although the gate 40 in FIG. 1 is illustrated as filling the trench T10, the gate 40 may have a planar structure. In this example, a planar gate is disposed on the semiconductor substrate 100 without the trench T10. In addition, the structure of the device portion DP10 may be modified in other various ways.

In at least some example embodiments, the buffer layer 110 in FIG. 1 may be excluded. In this example, the collector layer 120 may be disposed in direct contact with the back side (second or lower surface) of the semiconductor substrate 100, without the buffer layer 110. However, in view of the function of the buffer layer 110 (e.g., the field stop function), the inclusion of the buffer layer 110 may contribute to improved characteristics of the transistor.

FIGS. 5A to 5H are cross-sectional views for describing a method of manufacturing a transistor according to an example embodiment.

Figure 5A:
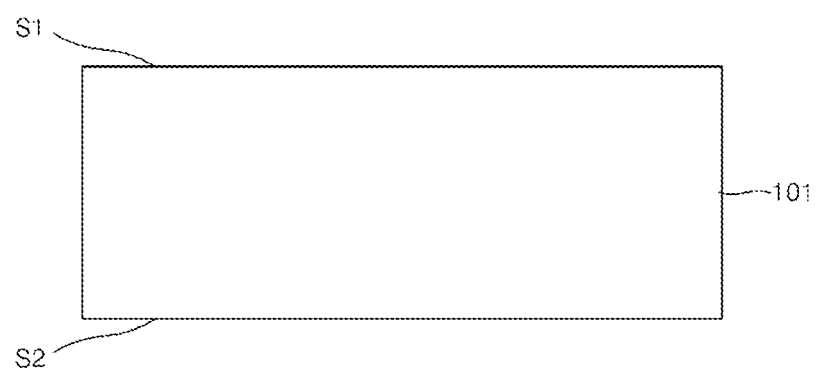
FIGS. 5A to 5H are cross-sectional views for describing a method of manufacturing a transistor according to an example embodiment.

Referring to FIG. 5A, a semiconductor substrate 101 having a first surface S1 and a second surface S2 is prepared. In this example, the first surface S1 is an upper surface, and the second surface S2 is a lower surface. The first surface S1 may be a back side of a final device (e.g., transistor), whereas the second surface S2 may be a front side of the final device. For this reason, as used herein with regard to at least some example embodiments, the terms "first surface S1" and "second surface S2" are interchangeable with the "back side" and "front side", respectively. The semiconductor substrate 101 may be, for example, a silicon substrate. The semiconductor substrate 101 may be a substrate lightly doped with n-type impurities. A doping concentration of the n-type impurities may be, for example, about $10^{13} \sim 10^{16}/cm^3$. In consideration of this concentration level of the n-type impurities, the semiconductor substrate 101 may be regarded as an n-substrate. A material and doping concentration of the semiconductor substrate 101 may be varied, not limited to the above.

Figure 5B:
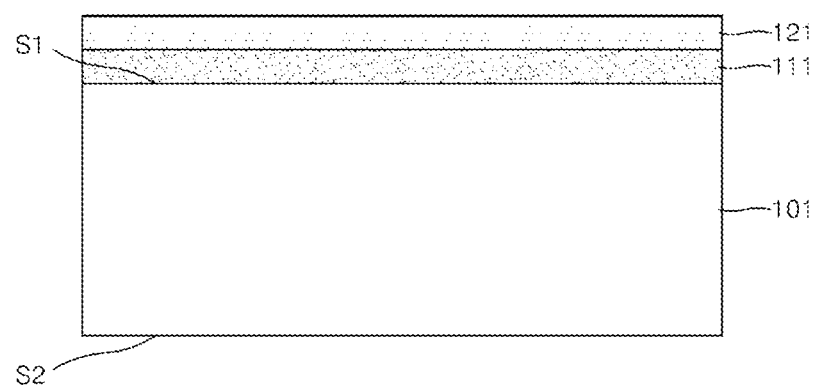

Referring to FIG. 5B, a buffer layer 111 and a collector layer 121 are sequentially formed on the first surface S1 of the semiconductor substrate 101. The buffer layer 111 and the collector layer 121 are each formed by an epitaxial growth method. While the buffer layer 111 is grown by an epitaxial process, a given, desired or predetermined type of impurities may be doped into the buffer layer 111. Likewise, while the collector layer 121 is grown by an epitaxial process, a given, desired or predetermined type of impurities may be doped into the collector layer 121. A material of the buffer layer 111 may be silicon, and the buffer layer 111 may be doped with n-type impurity ions. The buffer layer 111 may have an n-type impurity concentration that is greater than the n-type impurity concentration of the semiconductor substrate 101. For example, the buffer layer 111 may have an n-type impurity concentration of about $10^{14}$~$10^{18}$/cm$^3$. In consideration of this concentration level of the n-type impurities, the buffer layer 111 may be regarded as an nO layer. The buffer layer 111 may have a thickness of, for example, about 0~10 μm. The buffer layer 111 may be a field stop layer. A material of the collector layer 121 may be silicon, and the collector layer 121 may be doped with p-type impurity ions. The collector layer 121 may have a p-type impurity concentration of about $10^{17}$~$10^{21}$/cm$^3$. In consideration of this concentration level of the p-type impurities, the collector layer 121 may be regarded as a p+ layer. The collector layer 121 may have a thickness of, for example, about 0~5 μm.

As described above, since impurities are doped into the buffer layer 111 and the collector layer 121 while growing the buffer layer 111 and the collector layer 121 by the epitaxial process, the doping profiles thereof may be more easily controlled. If a buffer region and a collector region are formed by injecting impurity ions into a back side of a substrate by ion implantation and then annealing the impurity ion-injected region, controlling the doping profile of the buffer region and collector region is relatively difficult. This is because the impurity ions diffuse and form a doping profile with Gaussian distribution (e.g., normal distribution) when the annealing of the ion-injected region. Accordingly, it is relatively difficult to relatively accurately control the doping profile of the back side portion.

However, as in the above-described example embodiments, when the buffer layer 111 and the collector layer 121 are doped with impurities by supplying an impurity source gas while being grown by an epitaxial process, the doping profiles of the buffer layer 111 and the collector layer 121 may be controlled more precisely. The doping profiles of the buffer layer 111 and the collector layer 121 may be more easily controlled by adjusting a supplying amount and concentration of the impurity source gas. For example, according to at least some example embodiments, the buffer layer 111 and the collector layer 121 may be formed to have a doping profile with non-normal distribution (e.g., non-Gaussian distribution). The doping profile of the buffer layer 111 and the collector layer 121 may be the same as or similar to one of the doping profiles shown in FIGS. 2 to 4. As such, according to at least some example embodiments, the doping profiles of the buffer layer 111 and the collector layer 121 may be more precisely controlled, and thus, the operating characteristics of the transistor may be more easily improved.

In the related art, after forming a device portion on a front side of a substrate, impurity ions are implanted into a back side of the substrate to form an ion-implanted region, and an annealing process is performed with respect to the ion-implanted region. In this case, the annealing process may adversely affect the device portion on the front side of the substrate, and thus, the characteristics of the device portion may be deteriorated. Also, for this reason, conditions of the annealing process may be somewhat limited. However, in the above-described example embodiments, the buffer layer 111 and the collector layer 121 are formed by an epitaxial process on the first surface S1 of the semiconductor substrate 101 prior to forming a device portion on the second surface S2 of the semiconductor substrate 101. Thus, the above described problems in the related art may be suppressed and/or prevented.

Figure 5C:
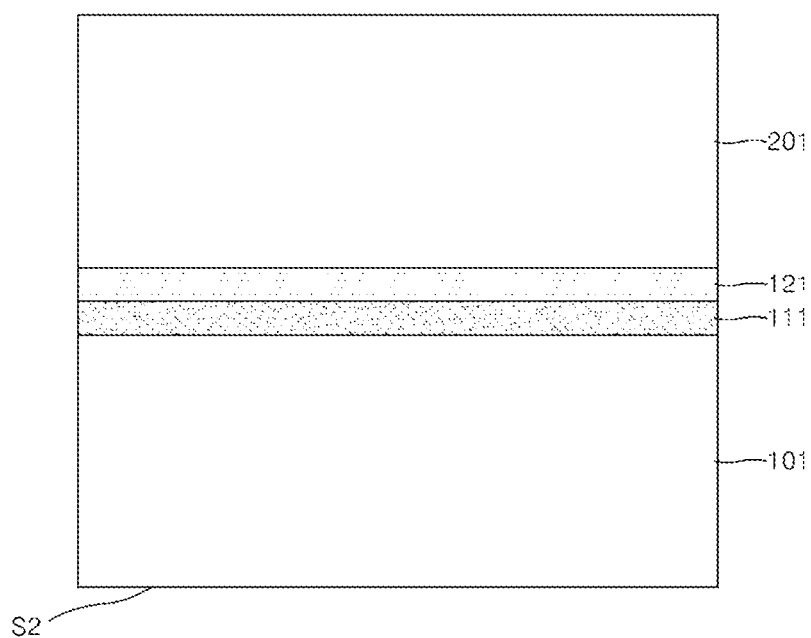

Referring to FIG. 5C, a support substrate 201 is formed on the collector layer 121. The support substrate 201 serves as a temporary substrate or a handling substrate. A material of the support substrate 201 may be, for example, glass or silicon. The material of the support substrate 201 is not limited to these materials, and may be any of a variety of materials. In at least some example embodiments, an adhesive layer (not shown) or a sacrificial layer (not shown) may be further formed between the collector layer 121 and the support substrate 201.

Figure 5D:
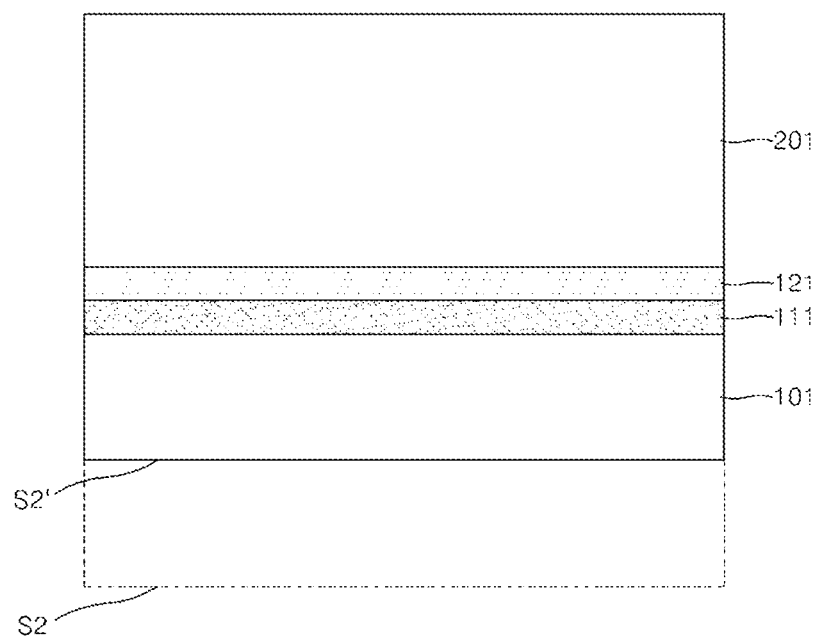

Referring to FIG. 5D, a portion of the semiconductor substrate 101 may be removed from the second surface S2, for example, by a grinding process. After the removing of the portion of the semiconductor substrate 101 by the grinding process, an exposed surface S2' of the semiconductor substrate 101 may be subjected to a wet etching process.

Figure 5E:
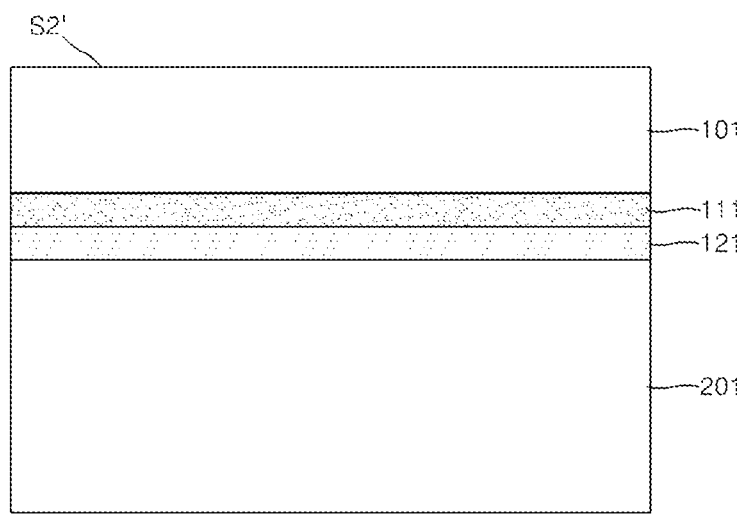

Referring to FIG. 5E, the resulting structure of FIG. 5D is inverted upside down.

Figure 5F:
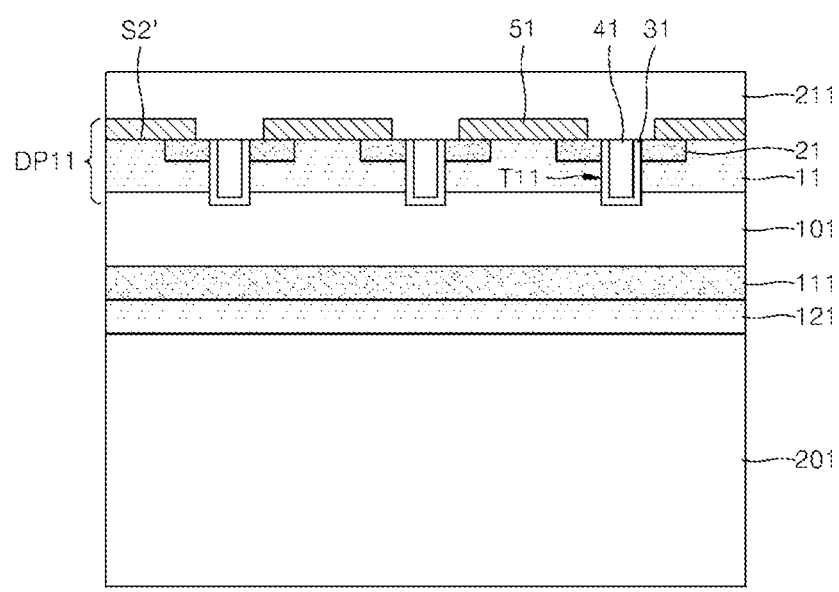

Referring to FIG. 5F, a device portion DP11 is formed on the exposed surface S2' (e.g., the upper surface S2') of the semiconductor substrate 101. In this example, the device portion DP11 includes a first-conductivity type well region 11, a second-conductivity type impurity region 21, a gate 41, and an emitter electrode 51. The first-conductivity type well region 11 is formed in an upper surface portion of the semiconductor substrate 101. The first-conductivity type well region 11 may be a p-type impurity-doped region. The first-conductivity type well region 11 may have a doping concentration of p-type impurities of, for example, about $10^{15}$~$10^{19}$/cm$^3$. In consideration of this concentration level of the p-type impurities, the first-conductivity type well region 11 may be regarded as a p0 region or a p+ region. The second-conductivity type impurity region 21 is formed on an upper surface portion of the first-conductivity type well region 11. The second-conductivity type impurity region 21 may be a region heavily doped with n-type impurities (e.g., an n+ region). The second-conductivity type impurity region 21 may have a doping concentration of n-type impurities of, for example, about $10^{18}$~$10^{21}$/cm$^3$. The gate 41 is disposed in a trench T11 formed in the semiconductor substrate 101. The trench T11 is formed to be deeper than the first-conductivity type well region 11 so as to pass through the second-conductivity type impurity region 21 and the first-conductivity type well region 11. A gate insulation layer 31 is formed on a bottom and inner side of the trench T11. The gate 41 is formed on the gate insulation layer 31 to fill the trench T11. The first-conductivity type well region 11 adjacent to the gate 41 may be used as a channel region, and electrical characteristics of the channel region may be controlled by the gate 41. The emitter electrode 51 is electrically connected with the first-conductivity type well region 11 and the second-conductivity type impurity region 21. That is, in this example, the emitter electrode 51 is formed to contact both the first-conductivity type well region 11 and the second-conductivity type impurity region 21. A passivation layer 211 is then formed to cover the device portion DP11.

Figure 5G:
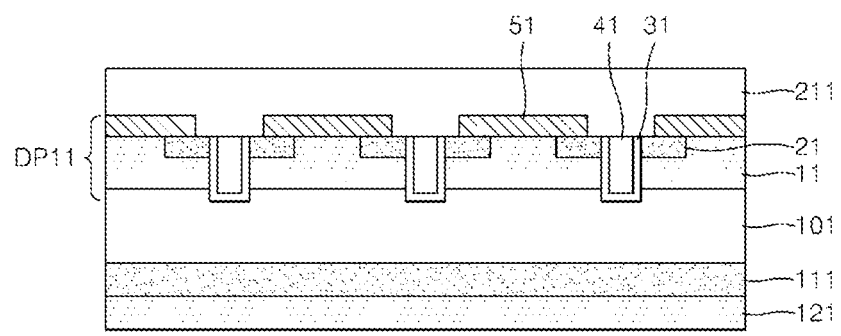

The support substrate 201 is removed from the collector layer 121 to obtain a resulting structure of FIG. 5G. The support substrate 201 may be removed using any one of various methods. For example, if an adhesive layer (not shown) or a sacrificial layer (not shown) is formed between the support substrate 201 and the collector layer 121, the support substrate 201 may be removed by weakening adhesive strength of the adhesive layer or by etching the sacrificial layer. Alternatively, the support substrate 201 may be removed by grinding or etching the same. The support substrate 201 may be removed by various other methods in addition to the above described methods.

Figure 5H:
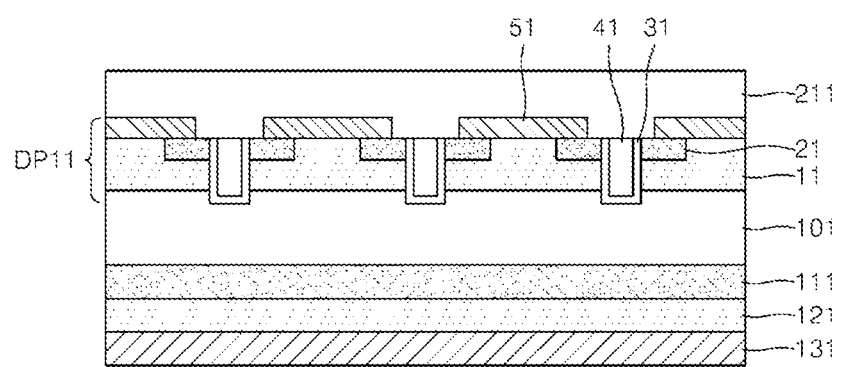

Referring to FIG. 5H, a collector electrode 131 is formed on a lower surface of the collector layer 121. The collector electrode 131 may be formed of any of a variety of conductive materials, such as a metal or a conductive oxide. Alternatively, the collector electrode 131 may not be formed in this stage; rather, the collector electrode 131 may be formed in the stage described with reference with FIG. 5B. For example, the collector electrode 131 may be formed on the collector layer 121 of FIG. 5B, and the support substrate 201 may be attached to the collector layer 131.

Although the method described with reference to FIGS. 5A to 5H uses a support substrate 201, the support substrate 201 may be omitted in some other example embodiments. For example, without the support substrate 201, the semiconductor substrate 101 may be removed by a given, desired or predetermined thickness (see FIG. 5D), and the device portion DP11 may be formed on the exposed surface S2' of the semiconductor substrate 101 (see, e.g., FIG. 5F).

Furthermore, although the method described with reference to FIGS. 5A to 5H involves the forming of the buffer layer 111 between the semiconductor substrate 101 and the collector layer 121, the buffer layer 111 may be omitted in some other example embodiments. The structure of the device portion DP11 may be varied in a variety of ways. For example, the gate 41 may be formed as a planar gate, rather than to fill the trench T11. The method described with reference to FIGS. 5A to 5H may be varied in a variety of ways, not limited to the above.

FIGS. 6A to 6F are cross-sectional views for describing a method of manufacturing a transistor according to another example embodiment.

Figure 6A:
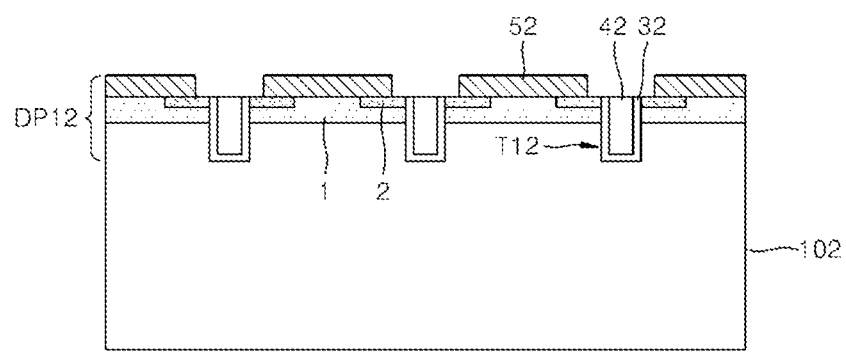
FIGS. 6A to 6F are cross-sectional views for describing a method of manufacturing a transistor according to another example embodiment.

Referring to FIG. 6A, a device portion DP12 is formed on a front side portion of a semiconductor substrate 102. The semiconductor substrate 102 may be the same as or similar to the semiconductor substrate 101 of FIG. 5A. The device portion DP12 includes a first ion implanted region 1 formed in a surface portion of the semiconductor substrate 102, and a second ion implanted region 2 formed in a surface portion of the first ion implanted region 1. The first ion implanted region 1 may be formed by implanting of first-conductivity type impurity ions, and the second ion implanted region 2 may be formed by implanting of second-conductivity type impurity ions. The device portion DP12 includes a trench T12, a gate insulation layer 32, a gate 42, and an emitter electrode 52. The trench T12, the gate insulation layer 32, the gate 42, and the emitter electrode 52 corresponds to the trench T11, the gate insulation layer 31, the gate 41, and the emitter electrode 51 shown in FIG. 5F, respectively. Thus, a detailed discussion is omitted.

Figure 6B:
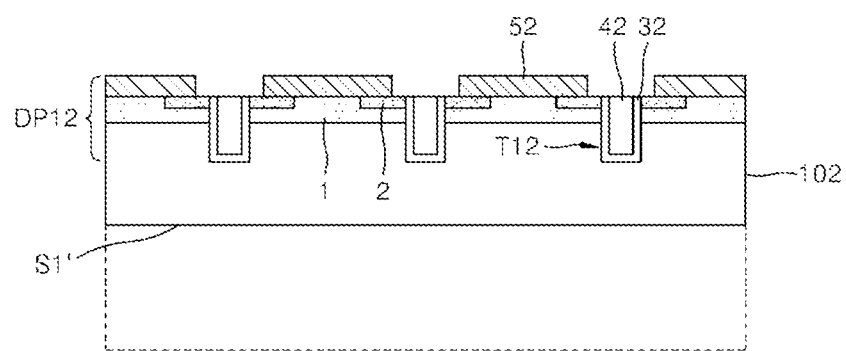

Referring to FIG. 6B a portion of the semiconductor substrate 102 is removed from the back side, for example, by a grinding process. After removing the portion of the semiconductor substrate 102, an exposed surface S1' of the semiconductor substrate 102 is subjected to a wet etching process.

Figure 6C:
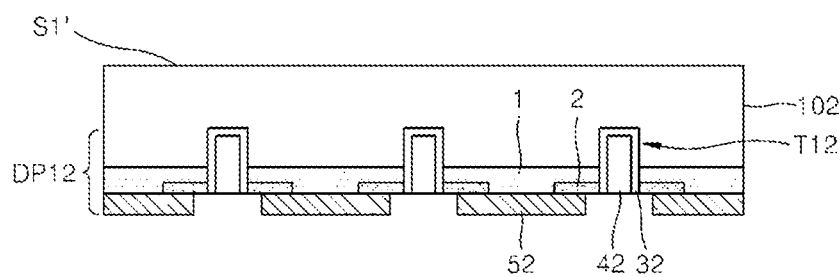

Referring to FIG. 6C, the resulting structure of FIG. 6B is inverted upside down.

Figure 6D:
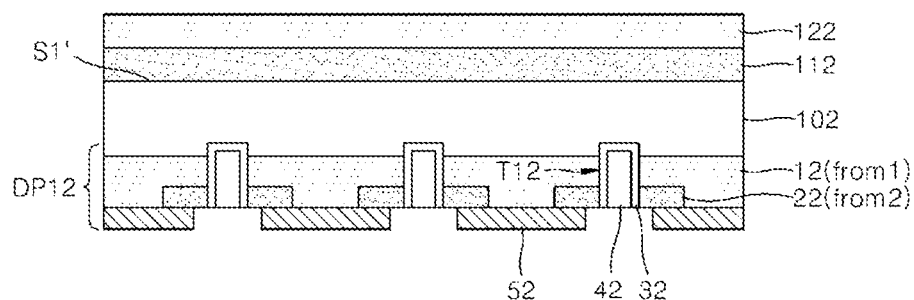

Referring to FIG. 6D, a buffer layer 112 and a collector layer 122 are sequentially formed on the exposed surface S1 (e.g., an upper surface) of the semiconductor substrate 102, for example, by an epitaxial growth method. The manufacturing method, property and doping profile of the buffer layer 112 and the collector layer 122 may be the same as or similar to those of the buffer layer 111 and the collector layer 121 of FIG. 5B described above, and thus detailed descriptions thereof will not be repeated here. In at least this example embodiment, during the formation of the buffer layer 112 and the collector layer 122, impurities of the first and second ion implanted regions 1 and 2 may be thermally diffused. That is, for example, the impurities of the first and second ion implanted regions 1 and 2 may be activated when forming the buffer layer 112 and the collector layer 122. As a result, a first-conductivity type well region 12 may be formed from the first ion implanted region 1, and a second-conductivity type impurity region 22 may be formed from the second ion implanted region 2. The first-conductivity type well region 12 and the second-conductivity type impurity region 22 may correspond to the first-conductivity type well region 11 and the second-conductivity type impurity region 21 of FIG. 5F, respectively. As described above, in at least this example embodiment, the first-conductivity type well region 12 and the second-conductivity type impurity region 22 may be formed through thermal diffusion of the impurities in the first and second ion implanted regions 1 and 2, at the same or substantially the same time as the formation of the buffer layer 112 and the collector layer 122, so that the overall manufacturing process may be simplified.

Figure 6E:
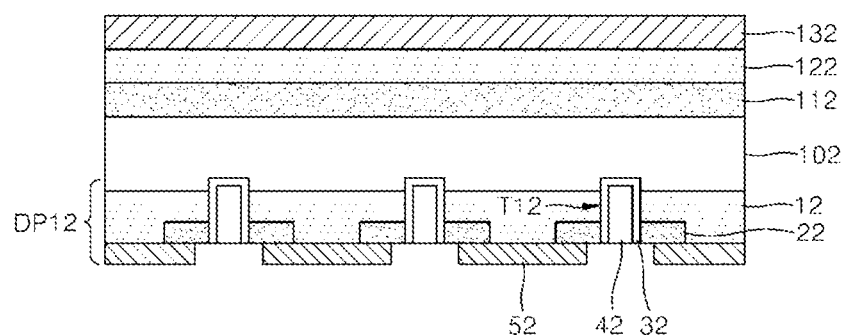

Referring to FIG. 6E, a collector electrode 132 is formed on the collector layer 122. The collector electrode 132 may be formed of any of a variety of conductive materials, such as a metal or a conductive oxide.

Figure 6F:
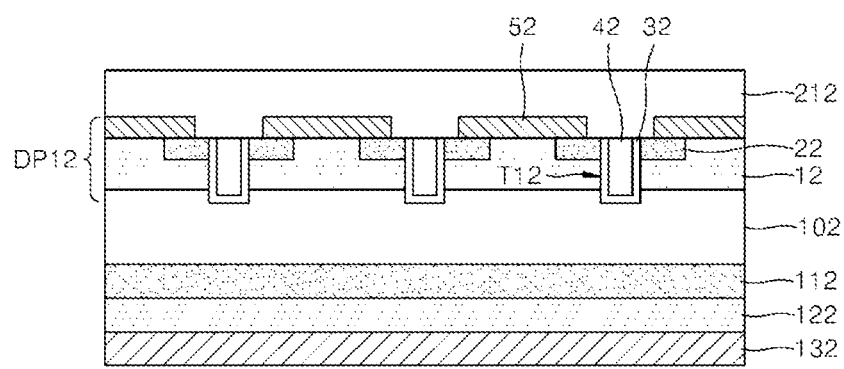

Referring to FIG. 6F, after the resulting structure of FIG. 6E is inverted upside down, a passivation layer 212 is formed to cover the device portion DP12. Alternatively, the passivation layer 212 may not be formed in this stage. For example, the passivation layer 212 may be formed in the stage shown in FIG. 6A or FIG. 6B.

The method described with reference to FIGS. 6A to 6F may be modified in various ways, similar or substantially similar to the method described with reference to FIGS. 5A to 5H.

As described above, according to the one or more of the above example embodiments, through the fine control of the doping profiles of the back side elements (e.g., the buffer layer and collector layer), a transistor (e.g., IGBT) with improved performance and/or operating characteristics may be manufactured more easily. For example, a transistor (e.g., IGBT) with improved hole-injection and/or tail current characteristics may be manufactured more easily.

It should be understood that the example embodiments described therein should be considered in a descriptive sense only and not for purposes of limitation. For example, it will be understood by one of ordinary skill in the art that the transistor structure of FIG. 1 and the doping profiles of FIGS. 2 to 4 may be varied in a variety of ways.

For example, the transistor of FIG. 1 may further include an additional doping region defined in the semiconductor substrate 100, and more complicated doping profiles than those of FIGS. 2 to 4 may apply. The manufacturing methods described with reference to FIGS. 5A to 5H, and FIG. 6A to 6F may be varied in a variety of ways. Furthermore, example embodiments are applicable to IGBT devices having a punch through (PT) or non-punch through (NPT) structure, in addition to the IGBT having a field stop layer.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. A method of manufacturing a transistor, the method comprising:

epitaxially growing a collector layer on a first side of a semiconductor substrate;

removing a portion of the semiconductor substrate from a second side of the semiconductor substrate; and forming a device portion in a surface region of the semiconductor substrate that is exposed by the removing of the portion of the semiconductor substrate from the second side of the semiconductor substrate.

2. The method of claim 1, further comprising:
doping the collector layer with an impurity during the epitaxially growing of the collector layer.

3. The method of claim 1, wherein the collector layer has a doping profile with a non-normal distribution.

4. The method of claim 1, further comprising:
epitaxially growing a buffer layer on the first side of the semiconductor substrate, wherein
the collector layer is epitaxially grown on the buffer layer.

5. The method of claim 4, further comprising:
doping the buffer layer with an impurity when epitaxially growing the buffer layer.

6. The method of claim 4, wherein the buffer layer has a doping profile with a non-normal distribution.

7. The method of claim 4, wherein the buffer layer is a field stop layer.

8. The method of claim 1, further comprising:
attaching a support substrate to the collector layer before removing the portion of the semiconductor substrate.

9. The method of claim 8, further comprising:
removing the support substrate after forming the device portion.

10. The method of claim 9, further comprising:
forming a collector electrode contacting the collector layer after removing the support substrate.

11. The method of claim 1, wherein the forming of the device portion comprises:
forming a first-conductivity type well region in the surface region of the semiconductor substrate;
forming a second-conductivity type impurity region in the first-conductivity type well region;
forming a gate configured to electrically control a portion of the first-conductivity type well region adjacent to the second-conductivity type impurity region; and
forming an emitter electrode that electrically contacts the first-conductivity type well region and the second-conductivity type impurity region.

* * * * *